United States Patent
Lee et al.

(10) Patent No.: US 6,862,203 B2
(45) Date of Patent: Mar. 1, 2005

(54) MEMORY WITH SHIELDING EFFECT

(75) Inventors: Wen-Chieh Lee, Hsinchu (TW); Chang-Ting Chen, Hsinchu (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

(21) Appl. No.: 10/658,324

(22) Filed: Sep. 10, 2003

(65) Prior Publication Data

US 2004/0240247 A1 Dec. 2, 2004

(30) Foreign Application Priority Data

May 27, 2003 (TW) .......................................... 92114314 A
Jun. 12, 2003 (CN) .......................................... 03142445 A

(51) Int. Cl.[7] ................................................. G11C 7/02
(52) U.S. Cl. ...................... 365/53; 365/63; 365/230.03
(58) Field of Search ....................... 365/53, 63, 230.03, 365/205, 54

(56) References Cited

U.S. PATENT DOCUMENTS 6,246,629 B1 * 6/2001 Watanabe et al. ....... 365/230.03

* cited by examiner

*Primary Examiner*—David Lam
(74) *Attorney, Agent, or Firm*—Rabin & Berdo, P.C.

(57) ABSTRACT

A semiconductor memory with shielding effect is disclosed in the invention. The memory includes at least a plurality of word lines, one ground line control unit, and a plurality of memory units. Every memory unit includes a primary bit line, a ground line, a first equivalent switch, and a second equivalent switch. The primary bit line is enabled by a control signal. The ground line and the ground line control unit are electrically connected. The first equivalent switch is coupled to both the primary bit line and the ground line, and is controlled by the control signal of the previous memory unit. The second equivalent switch is coupled to both the primary bit line and the ground line of the next memory unit, and is controlled by the control signal of the next memory unit.

7 Claims, 4 Drawing Sheets

US 6,862,203 B2

MEMORY WITH SHIELDING EFFECT

This application claims the benefit of Taiwan application Serial No. 92114314, filed May 27, 2003.

BACKGROUND OF THE INVENTION

1. Field of the Invention

The invention relates in general to a memory, and more particularly to a memory with shielding effect.

2. Description of the Related Art

FIG. 1A is a schematic diagram illustrating an equivalent circuit of a conventional read only memory. The memory includes multiple memory cell columns (C) that are connected to the sub bit lines adjacent to them. Every memory cell column (C) can be enabled through the word lines (WL0–WLm), and has m+1 memory cells where m is a positive integer. Every memory cell is used to store data of either 1 or 0. Every memory cell can be a transistor for which a threshold voltage Vt is embodied according to its to-be-stored data at manufacturing. By the control switches MB0–MB7, the block word line (BWL) can enable this memory block. The switches MS0, MS1, and MS3 determine whether the primary bit lines SB0, SB1, and SB2 are electrically connected to the sense amplifier control unit 130. The switches MS0, MS1, MS2 are controlled by the control signals SB0, SB1, and SB2 respectively. The primary bit lines SB0, SB1, SB2 are also electrically connected to the bit line control unit 110 by which the bit lines can be pulled high or pulled low. The ground lines GL0–GL3 are electrically connected to the ground line control unit 120 by which the ground lines can be pulled high or pulled low. By controlling the word lines WL0–WLm, the ground line G, the primary bit line SB, and the selective bit lines BRT and BLT, a cell which is to be read can be determined.

The operation of the read only memory aforementioned can be further explained by showing an example of reading a memory cell C5. When the word line WL, the control signal YS1, and the select signal BRT have been enabled, and additionally the ground line GL1 has been discharged to the ground level, the current flows to the ground line GL1 through the primary bit line SB1. The value stored in the memory cell can be obtained from amplifying the current of the primary bit line SB1 by the sense amplifier control unit.

Please note that at this moment, the primary bit line SB0 is floating and therefore the electric charges in SB0 also flows to GL1. Consequently, the current of SB1 is decreased and this may cause data misread. Therefore, there has to be a shielding mechanism to prevent from data misread.

The conventional memory uses the bit line control unit 110 and the ground line control unit 120 to create a shielding effect. In the example above, if the primary bit line is pulled low by the bit line control unit 110, a shielding mechanism, which can prevent the current flowing from primary bit line SB0 to ground line GL1, is created in the left hand side of ground line GL1; furthermore if the ground line control unit 120 pulls the ground lines GL2 and GL3 high, and the bit line control unit 110 pulls the primary bit line SB2 high, a shielding mechanism, that can prevent data misread, is created in the right hand side of the primary bit line SB1.

However, the shielding mechanism created by the bit line control unit 110 and the ground line control unit 120 complicate the logic of the circuit board. In addition, it is still possible to cause current leakage and data misread in this mechanism, the reason is stated below.

Please refer to FIG. 1B, which schematically shows the current flow of FIG. 1A. Every sub bit line is formed by buried diffusion layers and will inevitably cause resistance effect. When reading memory cell column C5, current I1 of the primary bit line SB1 flows downwards into the buried diffusion layers and the voltage at node N1 is assumed to be V1. The ground line GL2, which is controlled by the ground line control unit 120, is acting as a shielding mechanism. Current I2 flows upwards into the buried diffusion layers and the voltage at node N2 is assumed to be V2. Currents I1 and I2 are in different directions. When current I2 arrives at node N2, the buried diffusion layers which current I2 flows through is longer than that of current I1 arriving at node N1, and therefore voltage V2 at node N2 is smaller than voltage V1 at node N1. Due to the voltage difference between nodes N1 and N2, current leakage occurs and hence the correctness of the data is affected.

SUMMARY OF THE INVENTION

It is therefore an object of the invention to provide an improved and simplified semiconductor memory with shielding effect.

The invention achieves the above-identified objects by providing a semiconductor memory with shielding effect that includes at least multiple word lines, a ground line control unit, and multiple memory units. Each memory unit includes a primary bit line, a ground line, a first equivalent switch, and a second equivalent switch. The primary bit line is enabled by a control signal. The ground lines are electrically connected to the ground line control unit, and are essentially parallel to the primary bit lines. The first equivalent switch of the $n^{th}$ memory unit among those memory units is coupled to the primary bit line of the nth memory unit and the ground line of the nth memory unit, and is controlled by the control signal of the $(n-1)^{th}$ memory unit. The second equivalent switch of the $n^{th}$ memory unit is coupled to the primary bit line of the $n^{th}$ memory unit and the ground line of the $(n+1)^{th}$ memory unit, and is controlled by the control signal of the $(n+1)^{th}$ memory unit.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1A:
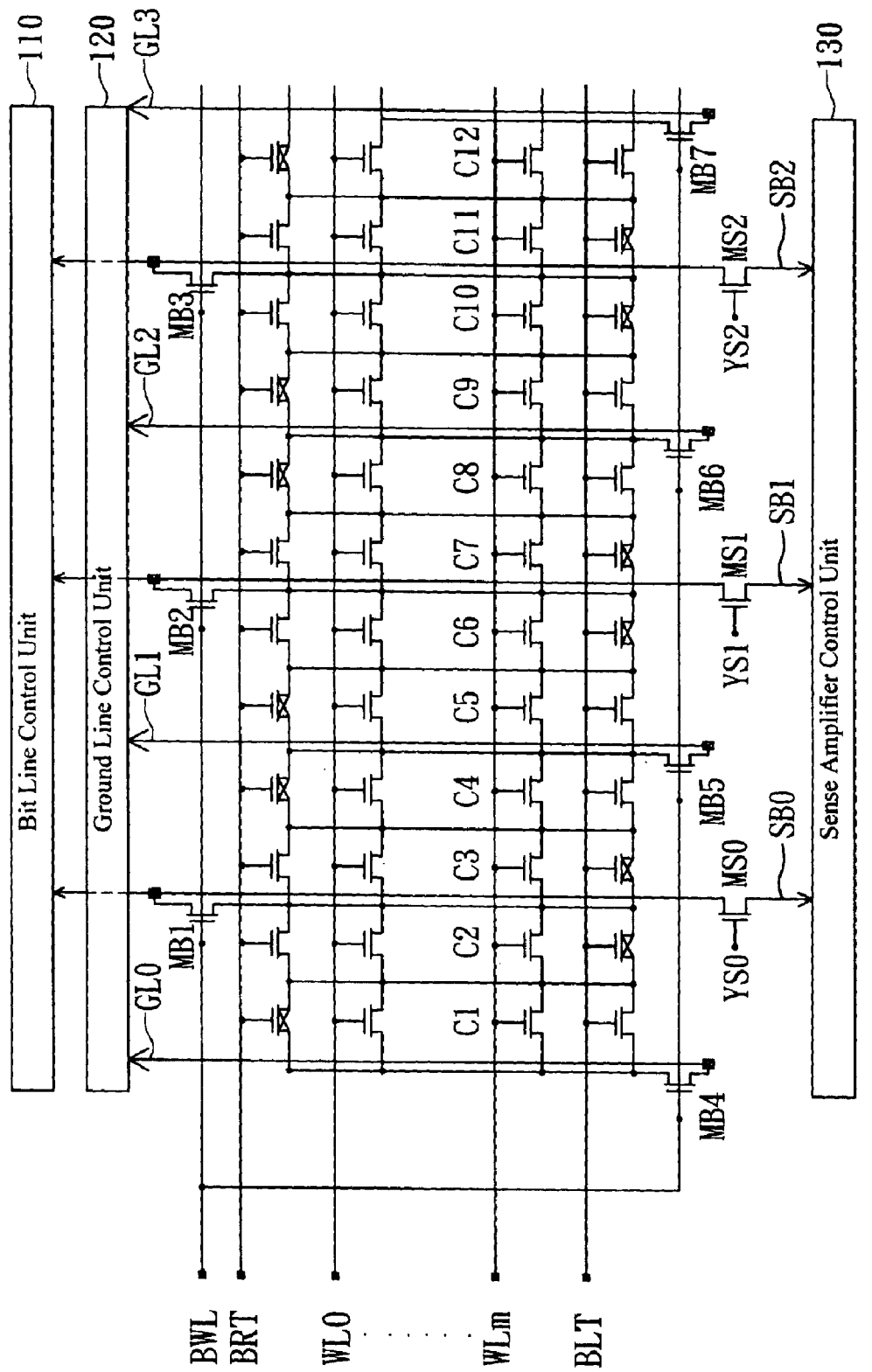
FIG. 1A is a schematic diagram illustrating an equivalent circuit of a conventional read only memory.
Figure 1B:
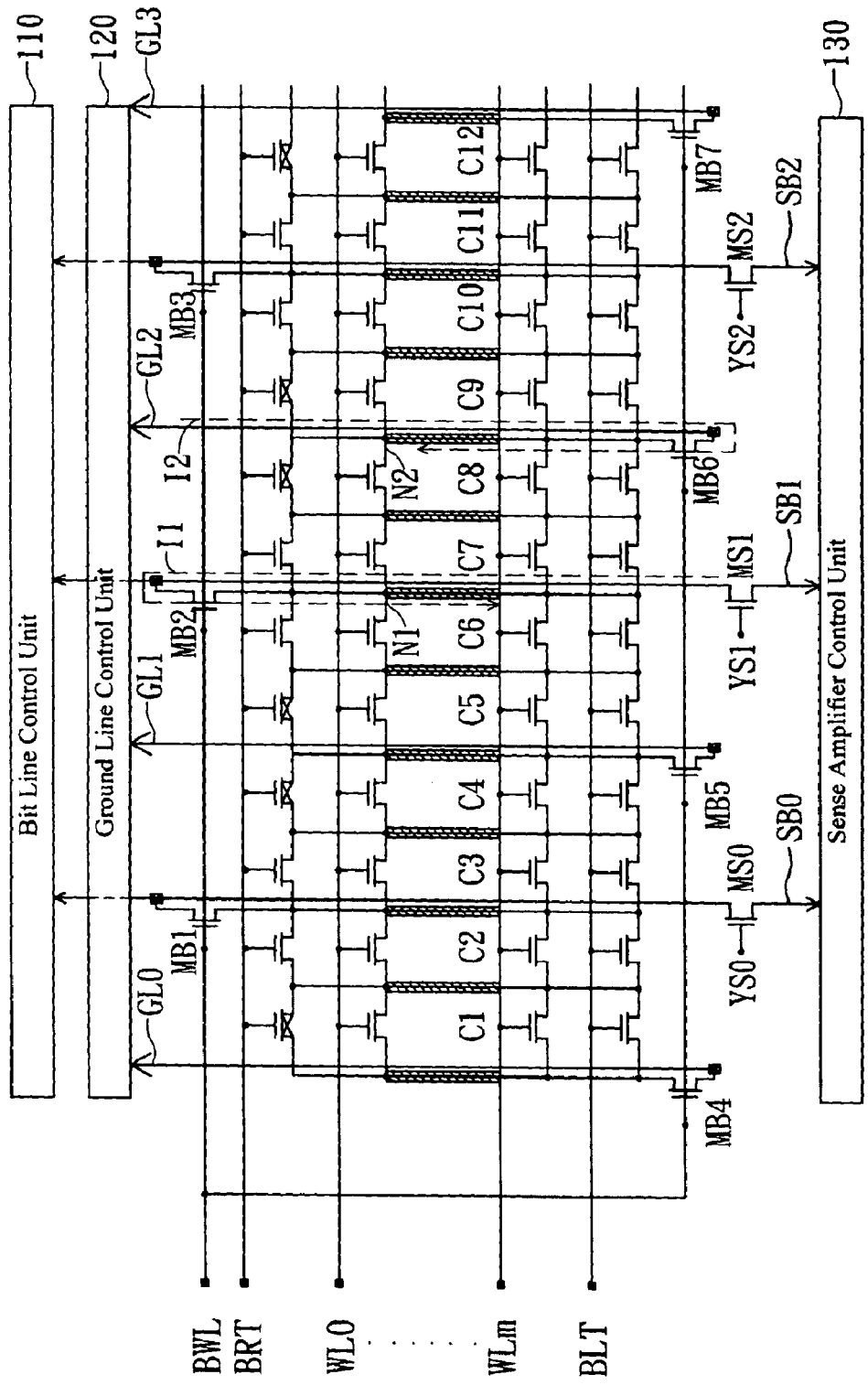
FIG. 1B is a schematic diagram illustrating the current flow of FIG. 1A.
Figure 2A:
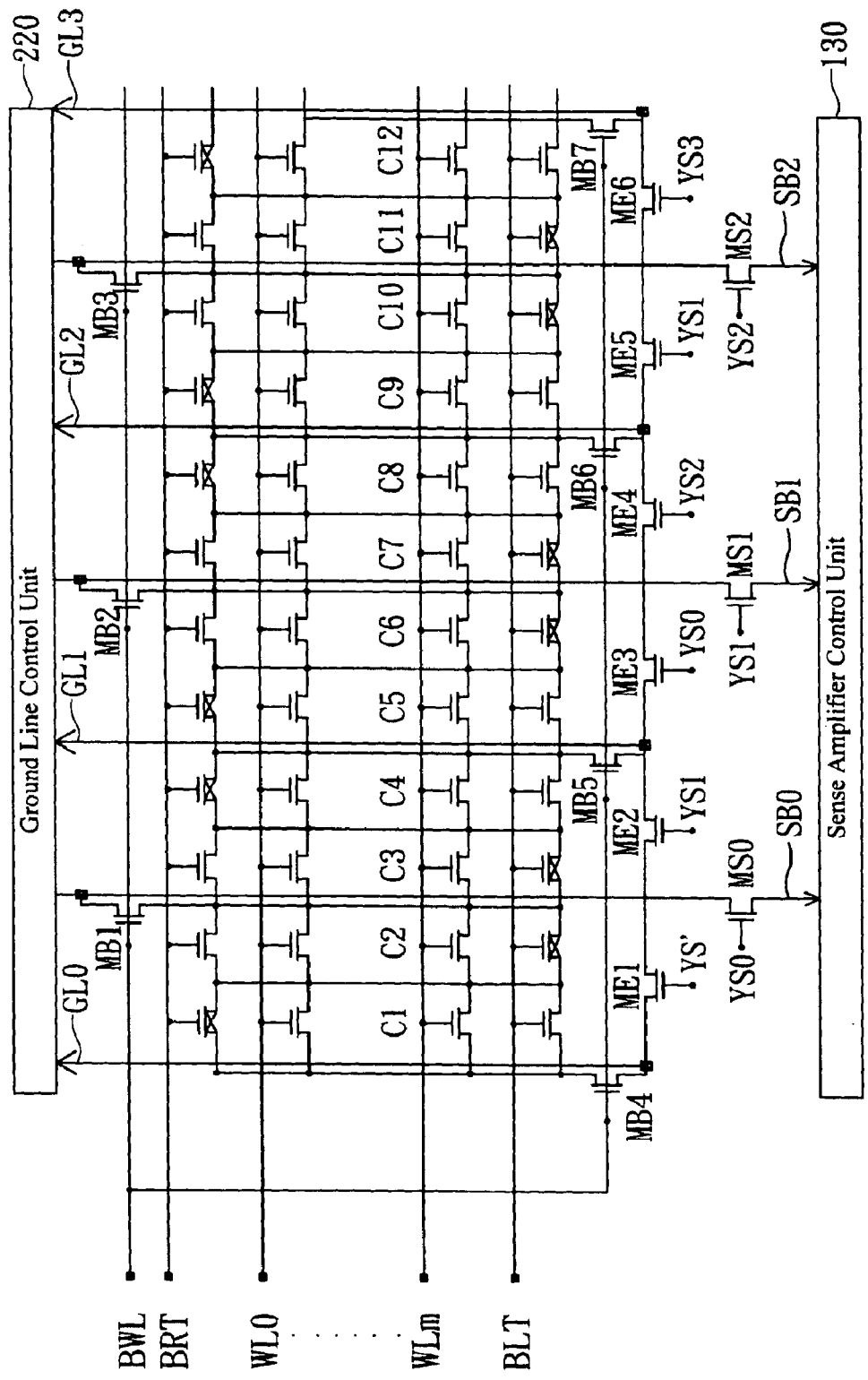
FIG. 2A is a schematic diagram illustrating an equivalent circuit of a semiconductor memory with shielding effect of the present invention.

FIG. 2A is a schematic diagram illustrating an equivalent circuit of a semiconductor memory with shielding effect. The memory includes multiple memory cell columns (C) that are connected to the sub bit lines adjacent to them. Every memory cell column (C) can be enabled according to the word lines (WL0–WLm), and has m+1 memory cells where m is a positive integer. Every memory cell is used to store data of either 1 or 0. Every memory cell can be a transistor for which a threshold voltage Vt is embodied according to its to-be-stored data at manufacturing. By controlling the switches MB0–MB7, the block word line (BWL) can enable this memory block. The switches MS0, MS1, and MS3 determine whether the primary bit lines SB0, SB1, and SB2 are electrically connected to the sense amplifier control unit 130. The switches MS0, MS1, MS2 are controlled by the control signals SB0, SB1, and SB2 respectively. The primary bit lines SB0, SB1, SB2 are also electrically connected to the bit line control unit 110 by which the bit lines can be pulled high or pulled low. The ground lines GL0–GL3 are electrically connected to the ground line control unit 120 by which the ground lines can be pulled high or pulled low. By controlling the word lines WL0–WLm, the ground line G, the primary bit line SB, and the selective bit lines BRT and BLT, a cell which is to be read can be determined.

The primary bit lines and the ground lines are created by metal layers, and the sub bit lines are created by buried diffusion layers. The primary bit lines and the ground lines are coupled to corresponding sub bit line by contact holes.

The features of this invention are the equivalent switches ME1–ME5, and the shielding effect can be achieved by controlling the equivalent switches ME1–ME6. The equivalent switches ME1–ME6 are connected to the ground line GL0, primary bit line SB0, ground line GL1, primary bit line SB1, ground line GL2, primary bit line SB2, and ground line GL3 respectively, and they are controlled by the control signals YS', YS1, YS2, and YS3 respectively. In this stated embodiment, the equivalent switches are transistors.

Following is an example for reading the memory cell C5. The word line WL and the select signal BRT corresponding to this memory are enabled, the ground line GL1 is discharged to the ground level, and the control signal YS1 enables the primary bit line SB1. The current flows to the ground line GL1 through the primary bit line SB1. The value stored in the memory cell can be obtained from amplifying the current of the primary bit line SB1 by the sense amplifier control unit 130. At the same time, the control signal YS1 enables the equivalent switch ME2. By doing so, the primary bit line SB0 and the ground line GL1 have same voltage, i.e. low level, a shielding mechanism is formed in the right hand side of ground line GL1. Control signal YS1 also enables the equivalent switch ME5. By doing so, the primary bit line SB2 and the ground line GL2 have the same voltage potential. At this moment, the ground lines GL2 and GL3 are both pulled high by the ground line control unit 220, consequently the voltage of the primary bit line is also pulled high by the equivalent switch ME5, and hence a shielding mechanism is created in the right hand side of the primary bit line SB1.

Figure 2B:
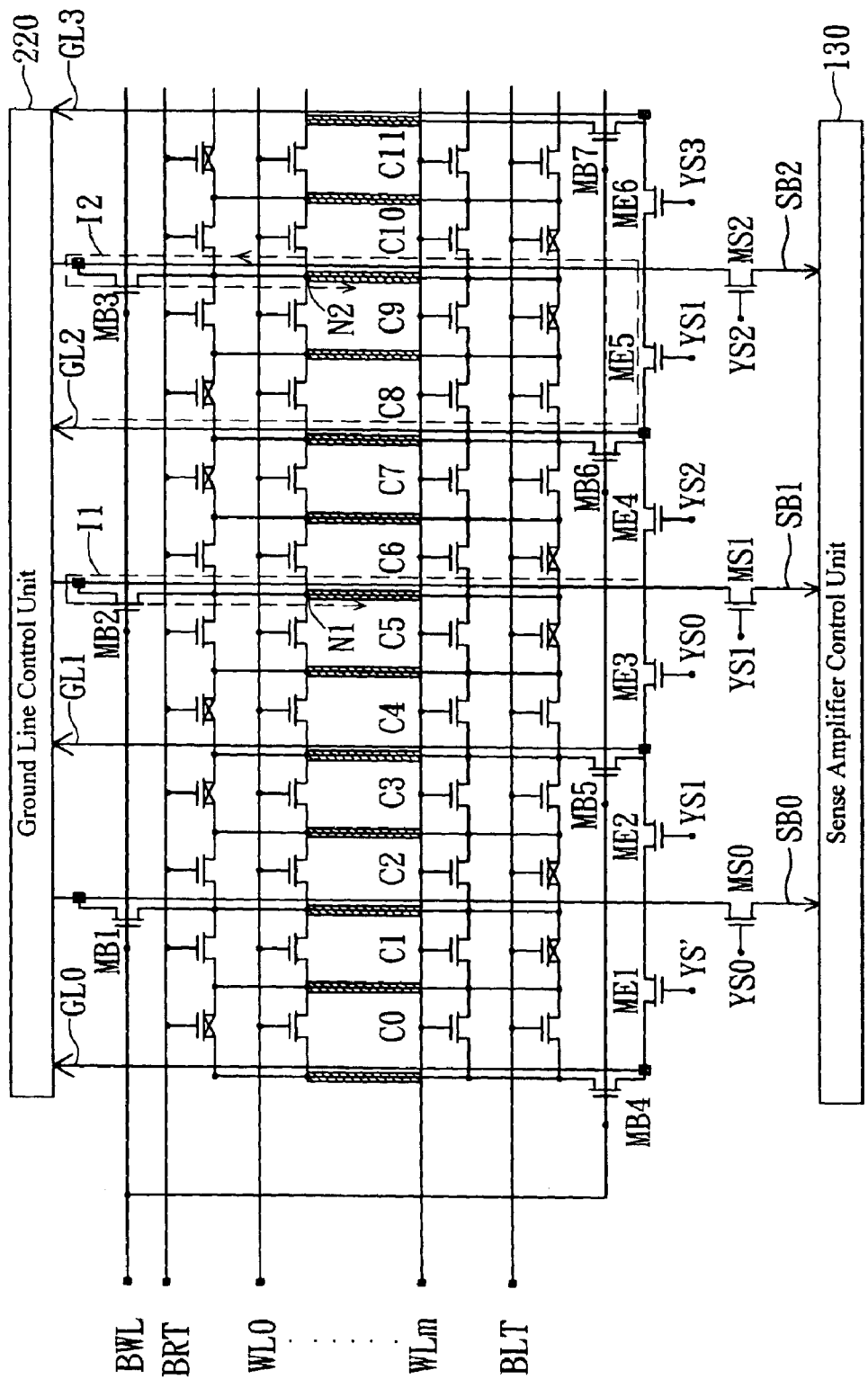
FIG. 2B is a schematic diagram illustrating the current flow of FIG. 2A.

FIG. 2B is a schematic diagram illustrating the current flow of FIG. 2A. Every sub bit line is created by buried diffusion layers and inevitably cause resistance effect. When reading memory cell column C5, current 11 of the primary bit line SB1 flows downwards into the buried diffusion layers and the voltage at node N1 is assumed to be V1. The ground line GL2 is pulled high by the ground line control unit 220 to create a shielding mechanism. Since the equivalent switch ME4 is turned on, the primary bit line SB2 is also pulled high. Current 12 of the primary bit line SB2 also flows downwards into the buried diffusion layers and the voltage at node N2 is assumed to be V2. Voltage V1 of node N1 is the same as voltage V2 of node N2 because currents 11 and 12 are in the same direction. Since there is no voltage difference between nodes N1 and N2, a better shielding mechanism of the invention increases the correctness in reading data.

The semiconductor memory with shielding effect provided by the invention at least includes the following advantages:
1. simplified circuit of shielding mechanism: Only the equivalent switches need to be coupled to their corresponding primary bit lines and ground lines to obtain the shielding effect and hence it increases the correctness in reading data.
2. better shielding effect: The resistance effect in the buried diffusion layers is decreased, and hence it increases correct reading rate.
3. preventing conflicts between primary bit lines: The primary bit lines sometimes have unpredictable conflicts; for example, electric charges' coupling with each other overload the primary bit lines and cause data misread. The discharging mechanism provided by the equivalent switches of the invention discharge the primary bit lines to adequate voltage and hence it increases the correctness in reading data.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor memory with shielding effect, comprising:
    a plurality of word lines which are parallel to each other;
    a ground line control unit; and
    a plurality of memory units, each memory unit comprising:
        a primary bit line which physically crosses the word lines perpendicularly, and the primary bit line is enabled by a control signal;
        a ground line which is electrically connected to the ground line control unit, and is parallel to the primary bit line;
        a first equivalent switch; and
        a second equivalent switch;
    wherein the first equivalent switch of the $n^{th}$ memory unit of the memory units is coupled to both the primary bit line of the $n^{th}$ memory unit and the ground line of the $n^{th}$ memory unit, and the first equivalent switch is controlled by the control signal of the $(n-1)^{th}$ memory unit;
    wherein the second equivalent switch of $n^{th}$ memory unit of the memory units is coupled to both the primary bit line of the $n^{th}$ memory unit and the ground line of the $(n+1)^{th}$ memory unit, and the second equivalent switch is controlled by the control signal of the $(n+1)^{th}$ memory unit;
    wherein n is positive integer.

2. The memory according to claim 1, wherein the memory further comprises:
    a sense amplifier control unit which is coupled to the primary bit lines of the memory units to amplify and sense the current of the primary bit lines.

3. The memory according to claim 1, wherein the memory unit further comprises:
    a first sub bit line, a second sub bit line, a third sub bit line, a forth sub bit line, and a fifth sub bit line which are physically parallel to the primary bit line, wherein the first sub bit line is coupled to the ground line, the third sub bit line is coupled to the primary bit line;

wherein the fifth sub bit line of the nth memory unit is the first sub bit line of the $(n+1)^{th}$ memory unit.

4. The memory according to claim 3, wherein the memory units further comprises:

four memory cell columns each comprises a plurality of memory cells and each of the memory cells is parallel and is connected to the adjacent first sub bit line, second sub bit line, third sub bit line, forth sub bit line, and fifth sub bit line.

5. The memory according to claim 1, wherein the first equivalent switch and the second equivalent switch are transistors.

6. A semiconductor memory with shielding effect, comprising:

a plurality of word lines which are parallel to each other;

a ground line control unit;

a plurality of memory units, each memory unit comprising:

a primary bit line which physically crosses the word lines perpendicularly, and the primary bit line is enabled by a control signal;

a ground line which is electrically connected to the ground line control unit, and is parallel to the primary bit line;

four memory cell columns each comprises a plurality of memory cells and each of the memory cells is parallel and is connected to the adjacent first sub bit line, second sub bit line, third sub bit line, forth sub bit line, and fifth sub bit line;

a first equivalent switch; and a second equivalent switch; and a sense amplifier control unit which is coupled to the primary bit lines of the memory units to amplify and sense the current of the primary bit lines;

wherein the first equivalent switch of the $n^{th}$ memory unit of the memory units is coupled to both the primary bit line of the $n^{th}$ memory unit and the ground line of the $n^{th}$ memory unit, and the first equivalent switch is controlled by the control signal of the $(n-1)^{th}$ memory unit;

wherein the second equivalent switch of $n^{th}$ memory unit of the memory units is coupled to both the primary bit line of the $n^{th}$ memory unit and the ground line of the $(n+1)^{th}$ memory unit, and the second equivalent switch is controlled by the control signal of the $(n+1)^{th}$ memory unit;

wherein the fifth sub bit line of the $n^{th}$ memory unit is the first sub bit line of the $(n+1)^{th}$ memory unit;

wherein n is positive integer.

7. The memory according to claim 6, wherein the first equivalent switch and the second equivalent switch are transistors.

* * * * *